United States Patent
Li

(10) Patent No.: US 6,465,825 B2
(45) Date of Patent: Oct. 15, 2002

(54) THIN FILM MULTILAYERED STRUCTURE, FERROELECTRIC THIN FILM ELEMENT, AND MANUFACTURING METHOD OF THE SAME

(75) Inventor: Xiao-min Li, Shiga-ken (JP)

(73) Assignee: Murata Manufacturing Co., Ltd. (JP)

( * ) Notice: Subject to any disclaimer, the term of this patent is extended or adjusted under 35 U.S.C. 154(b) by 99 days.

(21) Appl. No.: 09/745,224

(22) Filed: Dec. 21, 2000

(65) Prior Publication Data

US 2001/0006254 A1 Jul. 5, 2001

(30) Foreign Application Priority Data

Dec. 28, 1999 (JP) .............................. 11-374864

(51) Int. Cl.$^7$ .............................. H01L 29/76; B32B 9/00
(52) U.S. Cl. ................ 257/295; 257/310; 257/532; 438/3; 438/240; 438/253; 428/700
(58) Field of Search ................ 257/295, 310, 257/532; 438/3, 240, 253

(56) References Cited

U.S. PATENT DOCUMENTS

5,420,102 A * 5/1995 Harshavardhan et al. ... 505/237
5,472,510 A * 12/1995 Green ........................ 118/730
5,910,662 A * 6/1999 Itozaki et al. ................ 257/33
6,198,120 B1 * 3/2001 Sakurai et al. ............. 257/295

OTHER PUBLICATIONS

"Electrical Properties of Pb(Zr,Ti)O$_3$ Thin Film Capacitors on Pt and Ir Electrodes"; Takashi Nakamura, et al.; Jpn. J. Appl. Phys. vol. 34 (1995) pp. 5184–5187; Part I, No. 9B, Sep. 1995.

* cited by examiner

Primary Examiner—Cathy Lam
(74) Attorney, Agent, or Firm—Ostrolenk, Faber, Gerb & Soffen, LLP

(57) ABSTRACT

A thin film multilayered structure comprises a single crystal Si substrate; a MgO buffer layer epitaxially grown on said single crystal Si substrate; and a metallic thin film made of Ir or Rh epitaxially grown on said MgO buffer layer.

20 Claims, 2 Drawing Sheets

ND STRUCTURE,
THIN FILM MULTILAYERED STRUCTURE, FERROELECTRIC THIN FILM ELEMENT, AND MANUFACTURING METHOD OF THE SAME

BACKGROUND OF THE INVENTION

1. Field of the Invention

The present invention relates to thin film multilayered structures applicable to ferroelectric thin film elements using Si substrates, for example, capacitors for DRAMs and ferroelectric RAMs (FeRAM), pyroelectric elements, microactuators, thin film capacitors, small piezoelectric elements, etc., and manufacturing methods thereof. More specifically, it relates to metallic thin films epitaxially grown on Si substrates interposing buffer layers and manufacturing methods thereof.

2. Description of the Related Art

Recent years, techniques in forming thin films of dielectrics and ferroelectrics, for example, $BaTiO_3$, $SrTiO_3$, $(Ba,Sr)TiO_3$ (hereafter abbreviated as BST), $PbTiO_3$, $(Pb,La)TiO_3$, $Pb(Zr,Ti)O_3$ (hereafter abbreviated as PZT), $(Pb,La)(Zr,Ti)O_3$ (hereafter abbreviated as PLZT) and $Pb(Mg,Nb)O_3$, on Si substrates have been researched extensively.

In particular, if Pb perovskite type ferroelectrics, for example, PZT, and PLZT, having a large residual dielectric polarization could be epitaxially grown, the spontaneous polarization can be oriented in one direction, and then larger polarization values and switching characteristics can be realized. Therefore, the applicability to high density recording media is extremely increased so that requirements for establishment of methods in forming ferroelectric thin films, being excellent in crystalline properties, on Si substrates have intensified.

In the use for orienting the spontaneous polarization in one direction, the film thickness direction, as described above, a so-called MFM (metal-ferroelectric-metal) structure where a ferroelectric thin film is interposed between an upper and a lower metallic thin films (electrode layer) on a Si substrate has been generally used. However, it is difficult to improve crystalline properties of ferroelectric thin films in this structure for reasons described below, and ferroelectric thin films having fully satisfying crystalline properties have not been obtained until now.

That is, when a metallic material, for example, Al, Cu, Ag and Au, is used as a metallic thin film (lower electrode) formed on a Si substrate, a metallic oxide film is formed at the interface of the metallic thin film and the ferroelectric thin film during the formation of the ferroelectric thin film on said lower electrode. Mutual diffusion is likely to occur between the aforementioned metallic material and the Si substrate so that in the case in which a semiconductor element, etc., is formed on the Si substrate, the characteristics thereof may be changed.

A method using Pt as the metallic thin film is also taken into consideration. Pt has advantages in that it is difficult to be oxidized in air and it is likely to cause lattice matching with PZT and ferroelectrics, for example, PLZT, and BST. However, because Pt is inherently likely to form compounds with elements, for example, Si and Pb, it was feared that the characteristics of the semiconductor elements formed on the Si substrate might be changed, and compounds with ferroelectrics containing Pb formed at the interface so that the crystalline properties of ferroelectric thin films formed thereon might be degraded. A phenomenon wherein oxygen diffuses into the lower layer through grain boundaries of the Pt thin film was observed, and it was feared that, although Pt itself is difficult to be oxidized, characteristics of elements or films, for example, semiconductor elements, positioned in the under layer of the Pt thin film might be badly effected.

Regarding this point, Ir or Rh having a face-centered cubic structure has, similarly to Pt, a high conductivity, is better in processability compared to Pt, and furthermore, has a diffusion barrier function against oxygen so that the phenomenon wherein oxygen diffuses into the lower layer through the Ir thin film does not occur. Ir is not likely to react with other elements so that problems accompanied with using Pt such as the change in the characteristics of semiconductor elements and the degradation of crystalline properties of ferroelectric thin films can be suppressed.

As described above, Ir and Rh are said to be suitable materials for electrode layers to manufacture ferroelectric thin films being excellent in crystalline properties. However, regarding the forming of Ir or Rh thin film on a Si substrate, it was difficult to cause the epitaxial growth by conventional methods. For example, although Nakamura et al. formed the Ir thin film, as the electrode of the PZT thin film capacitor, on a $SiO_2/Si$ substrate by the RF magnetron sputtering method (Jpn. J. Appl. Phys. Vol.34 (1995), 5184), the obtained Ir thin film was not a epitaxial film but a film having the (111) preferred orientation. Although Horii et al. formed the Ir thin film on a YSZ/Si substrate by the sputtering method (The Japan Society of Applied Physics and Related Societies / Extended Abstracts (The 45th Meeting (1998)), only a film in which the (100) and (111) orientations are mixed with each other was obtained.

SUMMARY OF THE INVENTION

Accordingly, the object of the present invention is to provide a substrate metallic thin film which functions to form epitaxial ferroelectric thin films of excellent crystalline properties on Si substrates, and to provide a manufacturing method thereof.

The thin film multilayered structure comprises: a single crystal Si substrate; a MgO buffer layer epitaxially grown on said single crystal Si substrate; and a metallic thin film made of Ir or Rh epitaxially grown on said MgO buffer layer.

The single crystal Si substrate and the MgO buffer layer preferably fulfill the crystallographic relations:

MgO (001) // Si (001); and
MgO [100] // Si [100]

It is more preferable that said single crystal Si substrate, said MgO buffer layer and said metallic thin film fulfill the crystallographic relations:

metallic thin film (001) MgO (001) // Si (001), and
metallic thin film [100] // MgO [100] // Si [100].

The MgO buffer layer preferable has a mean surface roughness of about 1.5 nm or less, and said metallic thin film preferably has a mean surface roughness of about 1.5 nm or less.

The ferroelectric thin film element comprises, in addition to the above-explained thin film multilayered structure, a ferroelectric thin film orientationally grown on said thin film multilayered structure and an upper electrode formed on said ferroelectric thin film.

The manufacturing method of a thin film multilayered structure comprises the steps of epitaxially growing a MgO buffer layer on a single crystal Si substrate; and epitaxially growing a metallic thin film made of Ir or Rh on said MgO buffer layer.

The MgO buffer layer is preferably formed at a temperature of about 350 to 900° C. and at a growth rate of 1.0 to 2.0 nm/min, and more preferably at a temperature of about 500 to 900°.

The manufacturing method of a ferroelectric thin film element comprises the step of, in addition to the above-explained method, orientationally growing a ferroelectric thin film is on said thin film multilayered structure and forming an upper electrode on said ferroelectric thin film.

By interposing the epitaxial MgO layer as the buffer layer on the Si substrate, and by adopting the thin film multilayered structured structure in which the metallic thin film of Ir or Rh, having a face-centered cubic structure, is formed on the MgO layer, an epitaxial metallic thin film excellent in crystalline properties and surface flatness can be formed on the Si substrate. Furthermore, functional thin films of ferroelectrics, etc., having high orientational properties with one or more axes can be formed on the epitaxial metallic thin film.

Ir and Rh are likely not to cause oxygen diffusion or react with other elements. Therefore, in the case in which the ferroelectric thin film element is formed on the Si substrate, by using the epitaxially grown Ir thin film or Rh thin film as the lower electrode of the ferroelectric thin film element, a ferroelectric thin film excellent in crystalline properties can be formed without changing the characteristics of the semiconductor element, etc., formed on the Si substrate.

For the purpose of illustrating the invention, there is shown in the drawings several forms which are presently preferred, it being understood, however, that the invention is not limited to the precise arrangements and instrumentalities shown.

DETAILED DESCRIPTION OF PREFERRED EMBODIMENTS

The Inventors earnestly researched to discover that Ir or Rh having a face-centered cubic structure can be epitaxially grown on a Si substrate by forming an MgO layer as an interposing buffer layer on the Si substrate, and have completed the present invention.

That is, it was noted that the selection of appropriate buffer layer is an important point for the epitaxial growth of Ir or Rh on the Si substrate. MgO is 0.421 nm in lattice length, and MgO grows epitaxially on the Si substrate. On the other hand, Ir having a face-centered cubic structure is 0.384 nm in lattice length and Rh is 0.372 nm in lattice length, being very close to the lattice length of MgO, so that it is possible to epitaxially grow Ir or Rh on the MgO film.

In the case in which the MgO thin film is used as the buffer layer in forming the epitaxial Ir thin film or epitaxial Rh thin film, it is desirable that not only the crystalline properties of the MgO thin film but also the surface have excellent flatness. Regarding this point, many experiments were made, and it was found out that by forming the MgO buffer layer at a film making temperature of about 350 to 900° C. and at a film making rate of about 1.0 to 2.0 nm/min, the flatness (specifically about 1.5 nm or less in mean surface roughness) sufficient for forming the epitaxial Ir thin film or epitaxial Rh thin film can be realized.

In the case in which the Ir thin film or Rh thin film is used as a lower electrode for forming ferroelectric thin films excellent in crystalline properties, not only the crystalline properties of the Ir thin film or Rh thin film but also the surface is desired to have excellent flatness. Experiments were made regarding this point, and it was found out that by forming the Ir electrode layer or Rh electrode layer at a film making temperature of about 500 to 900° C. and at a film making rate of about 1.0 to 2.0 nm/min, the flatness (specifically about 1.5 nm or less in mean surface roughness) sufficient for forming the ferroelectric thin films being excellent in crystalline properties can be realized.

Hereinafter, the preferred embodiments of the present invention are explained in detail with reference to the drawings.

First Embodiment

In this embodiment, a thin film capacitor constituted using a thin film multilayered structure according to the present invention and a manufacturing method thereof is explained with reference to FIG. 1.

Figure 1:
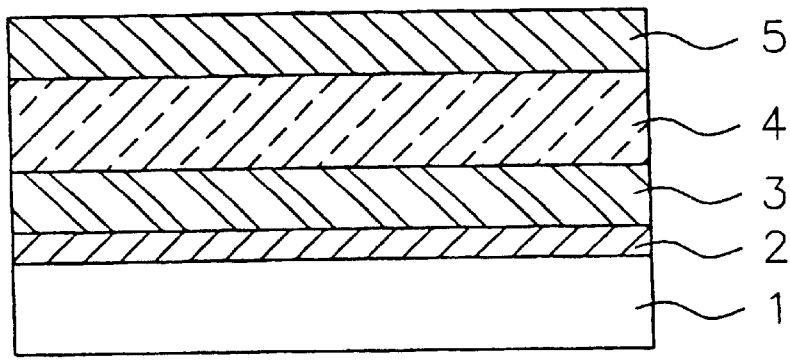
FIG. 1 is a sectional view showing a structure of a thin film capacitor formed according to the first embodiment of the present invention.

FIG. 1 is a sectional view showing a structure of a thin film capacitor according to this embodiment. In the drawing, 1 indicates a Si substrate; 2 indicates an MgO thin film being a buffer layer epitaxially grown on the Si substrate 1; 3 indicates an Ir thin film being a lower electrode of a thin film capacitor epitaxially grown on the MgO thin film 2; 4 indicates a PZT thin film epitaxially grown on the Ir thin film; and 5 indicates a Pt thin film formed on the PZT thin film 4 and being an upper electrode of the thin film capacitor, respectively.

Next, a manufacturing method of the aforementioned thin film capacitor 10 is explained. A Si (001) single crystal substrate 2 inches in diameter is prepared as the Si substrate 1. The Si substrate is subjected to the ultrasonic cleaning in an organic solvent, for example acetone or ethanol, and is immersed in a solution of $HF:H_2O:ethanol=1:1:10$ to remove oxide film on the surface of the Si substrate.

Then, using a laser vapor deposition apparatus (Pulsed Laser Deposition (PLD) Apparatus), a MgO thin film 2 about 50 nm thick is formed on the substrate under the conditions shown in Table 1. The obtained MgO thin film 2 is an epitaxial film. At this time, it is confirmed that the MgO thin film epitaxially grows at an oxygen pressure of $10^{-5}$ Torr level in a film making apparatus. However in order to obtain a MgO thin film more excellent in crystalline properties to improve the crystalline orientational property of the Ir thin film formed thereon, the pressure is desirably made to be $10^{-6}$ Torr or less. The purity of the used Mg metallic target is desired to be 99.9% or more. Furthermore, a sintered MgO target can also be used as the target, and in such a case, the relative density of the sintered MgO is preferably 90% or more, and more preferably 95% or more.

TABLE 1

| Laser Oscillator | ArF Excimer Laser |
|---|---|
| Wave Length | 193 nm |
| Laser Repeating Frequency | 3 Hz |
| Laser Energy Density | 4 J/cm$^2$ |
| Film Making Temperature | 650° C. |
| Target | Mg Metal |
| Atmosphere | Oxygen ($2 \times 10^{-6}$ Torr) |
| Substrate-Target Distance | 50 mm |
| Substrate Rotational Speed | 10 RPM |
| Film Making Rate | 1~2 nm/min |

After forming the MgO thin film, the oxygen supply is stopped, the background pressure is made to be $2 \times 10^{-7}$ Torr by evacuating for 10 minutes or more, and the target used in the film making is exchanged. Then, the pressure of the growing room is set at 2×10$^{-6}$ Torr using a pressure control valve, and an Ir thin film 3 about 100 nm thick is formed using the aforementioned MgO thin film as the buffer layer under the conditions shown in Table 2. At this time, the lattice length of Ir is very close to the lattice length of MgO so that the obtained Ir thin film 3 is epitaxially grown on the MgO thin film. The purity of used Ir metallic target is desired to be 99.9% or more.

TABLE 2

| Laser Oscillator | ArF Excimer Laser |
| --- | --- |
| Wave Length | 193 nm |
| Laser Repeating Frequency | 10 Hz |
| Laser Energy Density | 4 J/cm$^2$ |
| Film Making Temperature | 650° C. |
| Target | Ir Metal |
| Atmosphere | Vacuum (2 × 10$^{-6}$ Torr) |
| Substrate-Target Distance | 50 mm |
| Substrate Rotational Speed | 10 RPM |
| Film Making Rate | 1~2 nm/min |

The aforementioned MgO thin film 2 and Ir thin film 3 were successively formed in the same film making apparatus exchanging the target according to the thin film to be formed.

By forming a PZT thin film on thus obtained epitaxial Ir thin film 3, the epitaxially grown PZT thin film 4 is obtained. The thin film capacitor can be formed by making, for example, a Pt thin film as an upper electrode of the thin film capacitor on the PZT thin film 4 using a method of, for example, vapor deposition.

Figure 2:
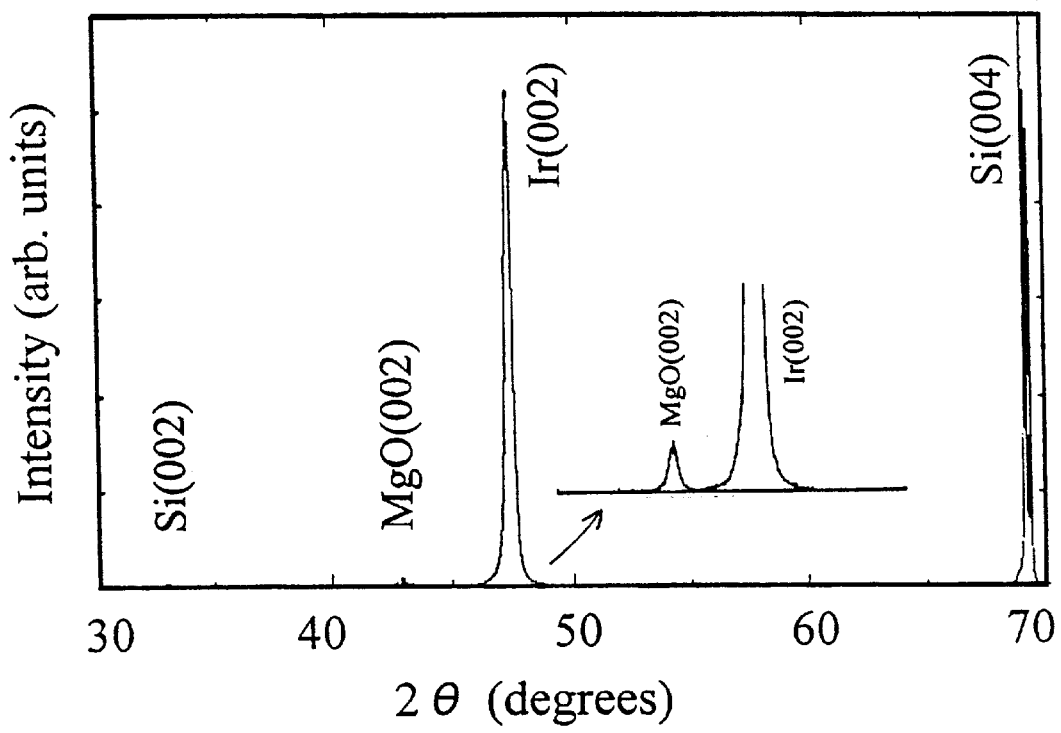
FIG. 2 is the result of the X-ray diffraction of the thin film multilayered structure obtained in the first embodiment.

Then, analytical results about the crystalline properties and the surface flatness of each thin film of the thin film capacitor obtained by the aforementioned method are explained. It is clear from the XRD diffraction pattern of Ir/MgO multilayered structure formed on the Si substrate (FIG. 2) that only a peak of MgO (002) and a peak of Ir (002) are detected besides the peaks based on Si (001) of the substrate. Therefore it is understood that each thin film is formed with (001) orientation (as the diffraction strength of MgO is weak compared to Ir, the ordinate axis scale has been magnified 20 times in the drawing). That is, the orientation of the directions of film growth fulfill the relation of Ir (001) // MgO (001) // Si (001).

Figure 3A:
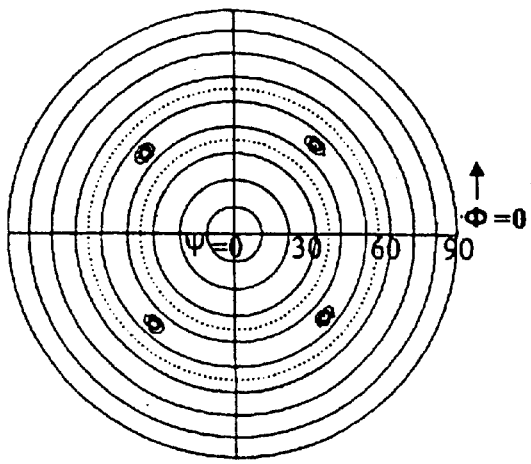
FIGS. 3A and 3B are the analytical results of the pole figure showing the orientational property in the film plane of the MgO thin film and the Ir thin film obtained in the first embodiment, respectively.
Figure 3B:
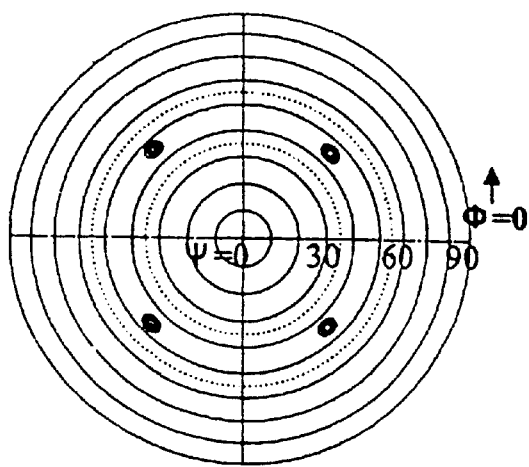

In order to confirm the orientational property in the film plane of the MgO thin film and the Ir thin film, each pole figure of the (220) plane was analyzed. The results are shown in FIGS. 3A and 3B. It can be understood from the drawing that because peaks of the symmetry are detected four times, the MgO thin film and the Ir thin film are determined to be epitaxially gown. By in situ observation using the reflection high-energy electron diffraction (RHEED), the orientation in a plane of Si thin film, MgO thin film and the Ir thin film was confirmed to fulfill the relation of Ir [100] // MgO [100] // Si [100]. That is, the [100] directions of the MgO thin film and the Si thin film coincide with the [100] direction of the Ir thin film in a plane perpendicular to the crystal growth direction.

In order to compare with the conventional techniques, a comparative example, in which the Ir thin film in the present embodiment was replaced with Pt, was prepared. The constitution of the thin film besides the part of Pt thin film and the film making conditions were the same with in the first embodiment. The Pt thin film was manufactured by the RF sputtering method using the Pt metallic target 99.9% or more in purity. The results of the comparison of the Pt thin film part in the comparative example with the Ir thin film part in the first embodiment are shown in Table 3.

TABLE 3

|  | Comparative Example | First Embodiment |
| --- | --- | --- |
| Thin Film Material | Pt | Ir |
| Film Making Rate (nm/min) | 1.5 | 1.5 |
| Orientational Property on MgO/Si | Epitaxial Growth | Epitaxial Growth |
| Half-Width of (002) Peak (°) | 2.41 | 2.19 |
| Mean Surface Roughness (nm) | 1.51 | 0.50 |

It is understood from the aforementioned Table 3 that the Ir thin film of the present embodiment has better crystalline properties compared to the Pt thin film of the comparative example (because the half-width of (002) peak is smaller), and a crystalline thin film having a flatter and more smooth surface was obtained. The half-width of (002) peak was determined from a XRD rocking curve. The mean surface roughness was measured using AFM about an area being 5 μm×5 μm in the thin film surface and show surface AFM patterns of the Ir thin film of this embodiment and the Pt thin film of the comparative example confirmed that the surface in the comparative example is uneven and relatively rough, while on the other hand, the surface in this embodiment is flat and smoother.

In the aforementioned embodiment, a Si (001) substrate was used, however the invention is not limited to this, and a substrate of Si (111), Si (110), etc., may be used. In the aforementioned embodiment, the MgO thin film and the Ir thin film is formed using the Pulsed Laser Deposition (PLD) Apparatus, however the invention is not limited to this, and thin films may be formed by another method, for example, the ion beam vapor deposition method, the ion beam sputtering method, the electron beam vapor deposition method, the molecular beam epitaxy method (MBE method) and chemical vapor deposition method (CVD method).

In the present embodiment, the epitaxially grown PZD thin film is formed on the epitaxially grown Ir thin film, however the invention is not limited to this, it being possible to similarly form dielectric thin films and ferroelectric thin films having high orientational properties with one or more axes.

Furthermore, in the present embodiment, the example in which the epitaxially grown Ir thin film is used as the lower electrode of the thin film capacitor is shown. However, a thin film multilayered structure having a structure composed of the epitaxially grown Ir / MgO / Si substrate can also be used in ferroelectric thin film elements besides thin film capacitors, for example, capacitors for DRAMs and ferroelectric RAMs (FeRAM), pyroelectric elements, microactuators, electrode films of, for example, small piezoelectric elements, etc.

Second Embodiment

The second embodiment according to the present invention is characterized in that the part related to the Ir thin film 3 in the first embodiment was replaced with a Rh thin film. In forming the Rh thin film, a Rh metallic target 99.9% or more in purity was used. The construction of other thin films and the film making conditions were the same as in the first embodiment so that the explanations thereof are omitted.

In the present embodiment in which the Ir thin film is replaced with the Rh thin film, by the analysis using X-ray diffraction, it was confirmed that the Rh thin film was epitaxially grown. Furthermore, by ATM observation of the surface state of the Rh thin film in the present embodiment, it was confirmed that the surface was a flat and minute film.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A thin film multilayered structure comprising:
   a single crystal Si substrate;
   an epitaxially grown MgO buffer layer on said single crystal Si substrate; and
   a metallic thin film comprising epitaxially grown Ir or Rh on said MgO buffer layer.

2. A thin film multilayered structure according to claim 1, wherein said single crystal Si substrate and said MgO buffer layer fulfill crystallographic relations:
   MgO (001) // Si (001); and
   MgO [100] // Si [100].

3. A thin film multilayered according to claim 1, wherein said single crystal Si substrate, said MgO buffer layer and said metallic thin film fulfill crystallographic relations:
   metallic thin film (001) // MgO (001) / Si (001), and
   metallic thin film [100] // MgO [100] // Si [100].

4. A thin film multilayered structure or a ferroelectric thin film element according to claim 3, wherein said MgO buffer layer has a mean surface roughness of about 1.5 nm or less.

5. A thin film multilayered structure or a ferroelectric thin film element according to claim 4, wherein said metallic thin film has a mean surface roughness of about 1.5 nm or less.

6. A thin film multilayered structure or a ferroelectric thin film element according to claim 2, wherein said MgO buffer layer has a mean surface roughness of about 1.5 nm or less.

7. A thin film multilayered structure or a ferroelectric thin film element according to claim 6, wherein said metallic thin film has a mean surface roughness of about 1.5 nm or less.

8. A thin film multilayered structure or a ferroelectric thin film element according to claim 1, wherein said MgO buffer layer has a mean surface roughness of about 1.5 nm or less.

9. A thin film multilayered structure or a ferroelectric thin film element according to claim 8, wherein said metallic thin film has a mean surface roughness of about 1.5 nm or less.

10. A thin film multilayered structure or a ferroelectric thin film element according to claim 1, wherein said metallic thin film has a mean surface roughness of about 1.5 nm or less.

11. A thin film multilayered structure or a ferroelectric thin film element according to claim 1, wherein said metallic thin film comprising Ir.

12. A thin film multilayered structure or a ferroelectric thin film element according to claim 1, wherein said metallic thin film comprising Rh.

13. A ferroelectric thin film element comprising:
    a thin film multilayered structure according to claim 5;
    an oriented ferroelectric thin film on said thin film multilayered structure; and
    an electrode on said ferroelectric thin film.

14. A ferroelectric thin film element comprising:
    a thin film multilayered structure according to claim 3;
    an oriented ferroelectric thin film on said thin film multilayered structure; and
    an electrode on said ferroelectric thin film.

15. A ferroelectric thin film element comprising:
    a thin film multilayered structure according to claim 2;
    an oriented ferroelectric thin film on said thin film multilayered structure; and
    an electrode on said ferroelectric thin film.

16. A ferroelectric thin film element comprising:
    a thin film multilayered structure according to claim 1;
    an oriented ferroelectric thin film on said thin film multilayered structure; and
    an electrode on said ferroelectric thin film.

17. A method of manufacturing a thin film multilayered structure comprising:
    epitaxially growing a MgO buffer layer on a single crystal Si substrate; and
    epitaxially growing a metallic thin film comprising Ir or Rh on said MgO buffer layer.

18. A manufacturing method of a thin film multilayered structure according to claim 17, wherein said MgO buffer layer is formed at a temperature of about 350 to 900° C. and at a growth rate of about 1.0 to 2.0 nm/min.

19. A manufacturing method of a thin film multilayered structure according to claim 18, wherein said MgO buffer layer is formed at a temperature of about 500 to 900° C. and at a growth rate of about 1.0 to 2.0 nm/min.

20. A manufacturing method of a ferroelectric thin film element comprising
    epitaxially growing a MgO buffer layer on a single crystal Si substrate;
    epitaxially growing a metallic thin film comprising Ir or Rh on said MgO buffer layer;
    orientationally growing a ferroelectric thin film on said metallic thin film; and
    forming an electrode on said ferroelectric thin film.

* * * * *